United States Patent
Yang

(10) Patent No.: US 6,235,614 B1
(45) Date of Patent: May 22, 2001

(54) METHODS OF CRYSTALLIZING AMORPHOUS SILICON LAYER AND FABRICATING THIN FILM TRANSISTOR USING THE SAME

(75) Inventor: Myoung-Su Yang, Kunpo-shi (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/311,711

(22) Filed: May 13, 1999

(30) Foreign Application Priority Data

Jun. 9, 1998 (KR) .................................................. 98-21286

(51) Int. Cl.[7] .............................. C30B 1/00; C30B 28/02; H01L 21/20; H01L 21/36; H01L 21/00

(52) U.S. Cl. ........................ 438/486; 438/166; 438/150; 438/795; 117/4

(58) Field of Search ...................................... 438/166, 150, 438/795, 797, 486, 705, 151, 482; 117/4

(56) References Cited

U.S. PATENT DOCUMENTS

| 5,306,651 | * | 4/1994 | Masumo et al. ....................... 437/40 |
| 5,432,122 | | 7/1995 | Chae . |
| 5,496,768 | | 3/1996 | Kudo . |
| 5,696,388 | | 12/1997 | Funada et al. .......................... 258/64 |
| 5,767,003 | | 6/1998 | Noguchi . |
| 5,817,548 | | 10/1998 | Noguchi et al. . |
| 5,858,807 | | 1/1999 | Kawamura . |
| 5,930,608 | * | 7/1999 | Yamazaki et al. .................... 438/166 |
| 6,072,550 | * | 6/2000 | Kim ........................................ 349/40 |

FOREIGN PATENT DOCUMENTS

| 0 141 506 | 5/1985 | (EP) . |
| 0 178 447 | 4/1986 | (EP) . |
| 0 456 199 | 11/1991 | (EP) . |
| 7-99314 | 4/1995 | (JP) . |
| 9-260684 | 10/1997 | (JP) . |
| 97/45827 | 12/1997 | (WO) . |
| WO 97/45827 | 12/1997 | (WO) . |

OTHER PUBLICATIONS

Robert S. Sposili, et al., Sequential lateral solidification of thin silicon films on $SiO_2$, Appl. Phyus. Lett. 69 (19), Nov. 4, 1996, pp. 2864–2866.

James S. Im, et al., Single–crystal Si films for thin–film transistor devices, Appln. Phys. Lett. 70 (25), Jun. 23, 1997, pp. 3434–3436.

J.P. Leonard, et al., The Effect of Film Thickness and Pulse Duration Variation in Excimer Laser Crystallization of Thin Si Films, Mat. Res. Soc. Symp. Proc. vol. 452, pp. 947–952, 1997.

(List continued on next page.)

Primary Examiner—Vu A. Le
Assistant Examiner—Adam Pyonin
(74) Attorney, Agent, or Firm—Long, Aldridge & Norman, LLP

(57) ABSTRACT

A method for crystallizing an amorphous silicon layer and for fabricating a thin film transistor. An amorphous silicon layer is formed on a substrate, and patterned to form an active layer by etching the amorphous silicon layer using photolithography. The amorphous silicon layer is crystallized using sequential lateral solidification to form a crystallized active layer having a smooth surface. A smooth surface is obtained by the crystallization process without a subsequent smoothing step by canceling an increased volume of silicon during crystallization for an increased surface of the active silicon layer. The crystallized silicon layer is used to form a thin film transistor by forming a gate insulating layer and a gate electrode on the crystallized active layer, and forming a source and a drain region by doping the crystallized active layer with impurities in use of the gate electrode as a mask.

4 Claims, 5 Drawing Sheets-

OTHER PUBLICATIONS

R.S. Sposili, et al., Single–Crystal Si Films Via a Low–Substrate–Temperature Excimer–Laser Crystallization Method, Mat. Res. Soc. Symp. Proc. vol. 452, pp. 953–958, 1997.

J.M. Im, et al., Single–Crystal Si Films for Thin–film Transistor Devices, Appl. Phys. Lett. 70 (25), pp.3434–3436, Jun. 23, 1997.

M.A. Crowder, et al., Low–Temperature Single–Crystal Si TFTs Fabricated on Si Films Processed Via Sequential Lateral Solidification, IEEE Electron Device Letters, pp. 1–3, Sep. 1997.

J.S. Im, et al., Controlled Super–Lateral Growth of Si Films for Microstructural Manipulation and Optimization, Physics Status Solid, pp. 1–7 w/8 pages of figures, Feb. 22, 1998.

James S. Im, et al., Crystalline Si Films for Integrated Active–Matrix Liquid–Crystal Displays, MRS Bulletin, Mar. 1996, pp. 39–48.

James S. Im, et al., Single Crystal Silicon Films Via a Low–Substrate–Temperature Excimer–Laser Crystallization Method, MRS Abstract 1996 Fall Meeting.

* cited by examiner

METHODS OF CRYSTALLIZING AMORPHOUS SILICON LAYER AND FABRICATING THIN FILM TRANSISTOR USING THE SAME

FIELD OF THE INVENTION

The present invention relates to methods for crystallizing an amorphous silicon layer and fabricating a thin film transistor thereof which fabricate a thin film transistor having an active layer of a silicon layer crystallized by sequential lateral solidification (SLS).

DISCUSSION OF THE RELATED ART

To fabricate a thin film transistor (TFT) on a low heat resistant substrate such as a glass substrate, an amorphous silicon layer or a polycrystalline layer as an active layer of a thin film transistor is formed on a substrate. However, such methods have disadvantages in that the characteristics of the formed semiconductor devices vary since an amorphous silicon layer has low charge carrier mobility and a polycrystalline silicon layer has grain boundaries which are located randomly.

There are various techniques for forming a polycrystalline silicon layer on a glass substrate, such as: (1) forming a polycrystalline silicon layer directly on a substrate; (2) forming an amorphous silicon layer on the substrate and crystallizing the amorphous silicon layer at a temperature of about 600 C by solidification; and (3) forming an amorphous silicon layer on the substrate and treating the amorphous silicon layer thermally with a laser.

The techniques (1) and (2) above is problematic when forming the layer on a glass substrate because the methods involve high temperatures. The technique (3) requires no high temperature and may be applied to a glass substrate, and enables the formation of polycrystalline silicon layers of high quality having low defect density inside the crystallized particles. However, the technique (3) also has problem that uniformity of electrical characteristics among the TFT devices is low as crystal field fails to be uniform.

In order to solve the problems, the distribution of crystal field must be controlled artificially, or fabrication of a single crystal device is required. A technique of forming a single crystalline silicon layer on a glass substrate by SLS is described in Robert S. Sposilli, M. A. Crowder, and James S. Im, Mat. Res. Soc. Symp. Proc. Vol. 452, 956957, 1997. The technique, using the fact that silicon grains tend to grow vertically against the interface between liquid and solid silicon, teaches that an amorphous silicon layer is crystallized by controlling the magnitude of laser energy and an irradiation range of a moving laser beam to have silicon grains grow laterally up to a predetermined length, as shown in the following example.

FIGS. 1A to 1C show the crystallized state of a silicon layer during an SLS process. Referring to FIG. 1A, the amorphous silicon layer is irradiated with a first shot of a laser beam having an elongated shape with a predetermined width. The energy of the laser beam is high enough to melt the irradiated portion of the silicon layer.

Consequently, a portion of the silicon layer having been irradiated with the laser beam is melted and crystallized. When the portion of the silicon layer is crystallized, lateral growth of grains proceeds from the interface between an amorphous silicon region and the melted silicon region. The lateral growth of the grains proceeds in a vertical direction against the interface.

The lateral growth stops in accordance with a width of the melted silicon region when: (1) grains having grown from both interfaces collide each other in the middle section of the melted silicon region; or (2) polycrystalline silicon particles are generated simultaneously in many places as the melted silicon region is solidified sufficiently to generate nuclei. The length of lateral growth of a grain attained by a single laser irradiation depends. on both laser energy and the thickness of the amorphous silicon layer.

Referring to FIG. 1B, the amorphous silicon layer is irradiated with a second shot of the laser beam, the amorphous silicon layer having been moved in the lateral direction by a distance which is less than the length of lateral growth of the grains resulted from the first laser beam irradiation.

Accordingly, the portion of silicon irradiated with the second irradiation of the laser beam is melted and then crystallized. Lateral growth,proceeds to the melted silicon region as the grains that are grown by the first irradiation act as seeds for crystallization.

Referring to FIG. 1C, the grains are grown to a predetermined lengths by repeating the steps of moving the amorphous silicon layer in the lateral direction, melting a portion of the amorphous silicon layer by irradiating it with the laser beam, and crystallizing the melted silicon layer. FIG. 1C shows the state of a crystallized silicon layer resulted from lateral growth of grains to predetermined sizes.

FIG. 2 is a schematic drawing illustrating a method of crystallizing an amorphous silicon layer using SLS to fabricate a wide vision LCD device. FIG. 3 shows the surface roughness of the cross-section of the silicon layer at the bisecting line IV in FIG. 2.

When an amorphous silicon layer having a large area is crystallized using SLS, the length of the laser beam of ten cannot cover the entire surface of the amorphous silicon layer. A plurality of scans are required for crystallizing the entire surface of the silicon layer as the lengths of the grains grown by SLS are much shorter than the length of the entire layer. Thus, crystallization of such a silicon layer is carried out simultaneously by SLS using a plurality of laser beams.

In FIG. 2, reference numeral 200 designates an insulated substrate on which an amorphous silicon layer is formed.

Reference numeral 201 indicates a portion of the amorphous silicon layer not yet crystallized. Reference numeral 202 designates the polycrystalline silicon regions formed by SLS. Each area 202 is formed by irradiating or scanning the silicon layer with a laser beam.

FIG. 3 shows a cross-section of the polycrystalline silicon region bisected by the line II I in FIG. 2. The line designated by numeral 31 represents the surface profile of the layer. The horizontal axis represents the direction of scan of the laser beam (from left to right).

In the silicon layer crystallized by SLS according to the related art, as shown in FIG. 3, the surface of the silicon layer protrudes out at or near a portion that is crystallized the last during a scan, i.e., a portion near the right end of a region 202. This is because during the process of solidification, the volume of the silicon increases after being irradiated with a laser beam. During an SLS process, the laser beam is scanned in one direction. At the end of a scan, the portion of the silicon layer solidified last (i.e. near the right end of the regions 202) is unable to push the solid silicon adjacent the melted silicon region, and the silicon grains protrudes upward as a result, as shown in FIG. 3.

When a portion of the silicon layer having the above-described uneven surface is used as an active layer of a thin film transistor, the characteristics of the thin film transistor is degraded due to the step difference on the surface of the silicon layer. Therefore, to be used as an active layer the surface of the silicon layer must be made smooth by removing the surface unevenness, such as by etching.

SUMMARY OF THE INVENTION

Accordingly, the present invention is directed to methods of crystallizing an amorphous silicon layer and fabricating a thin film transistor therefrom that substantially obviate one or more of the problems due to limitations and disadvantages of the related art.

An object of the present invention is to provide methods of crystallizing an amorphous silicon layer and for fabricating a thin film transistor which has an active layer having a smooth surface, by eliminating a protruding surface caused by an increased volume of silicon during crystallization by allowing the surface of a silicon layer to be increased. This is achieved by patterning the amorphous silicon layer to form an active layer by etching using photolithography, and subsequently crystallizing the patterned amorphous silicon layer.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purposes of the present invention, as embodied and broadly described, the present invention includes the steps of forming an amorphous silicon layer on a substrate, forming an active layer by etching the amorphous silicon layer, forming a crystallized active layer by crystallizing the active layer by sequential lateral solidification, forming a gate insulating layer and a gate electrode on the crystallized active layer, and forming a source and a drain region by doping the crystallized active layer with impurities using the gate electrode as a mask.

In another respect of the present invention, the present invention includes the steps of forming an amorphous silicon layer on a substrate, patterning the amorphous silicon layer selectively, and crystallizing the amorphous silicon layer having been patterned by sequential lateral solidification.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide. further understanding of the invention and are incorporated in and constitute a part of this application, illustrate embodiments of the invention and together with the description serve to explain the principle of the invention.

In the drawings:

FIGS. 1A 1C show processed states of silicon crystallized by SLS;

Figure 1A:
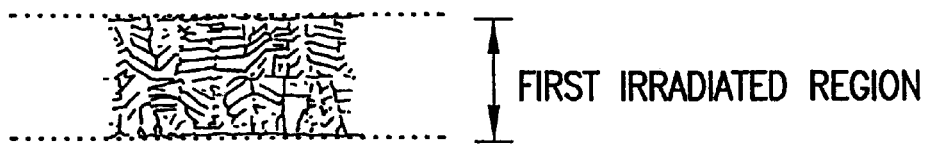
Figure 1B:
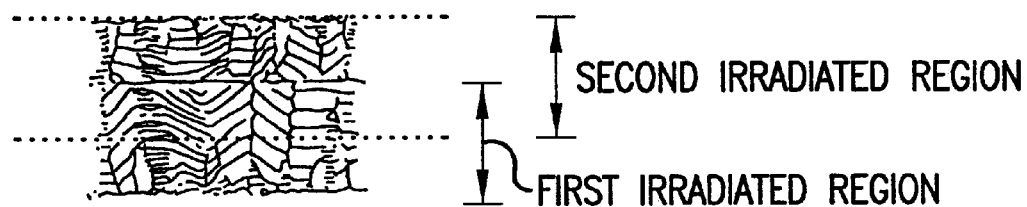
Figure 1C:
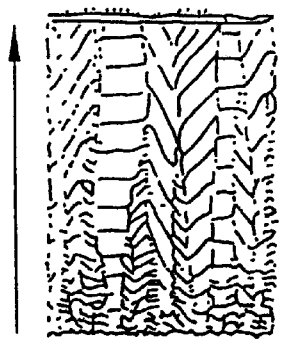
Figure 2:
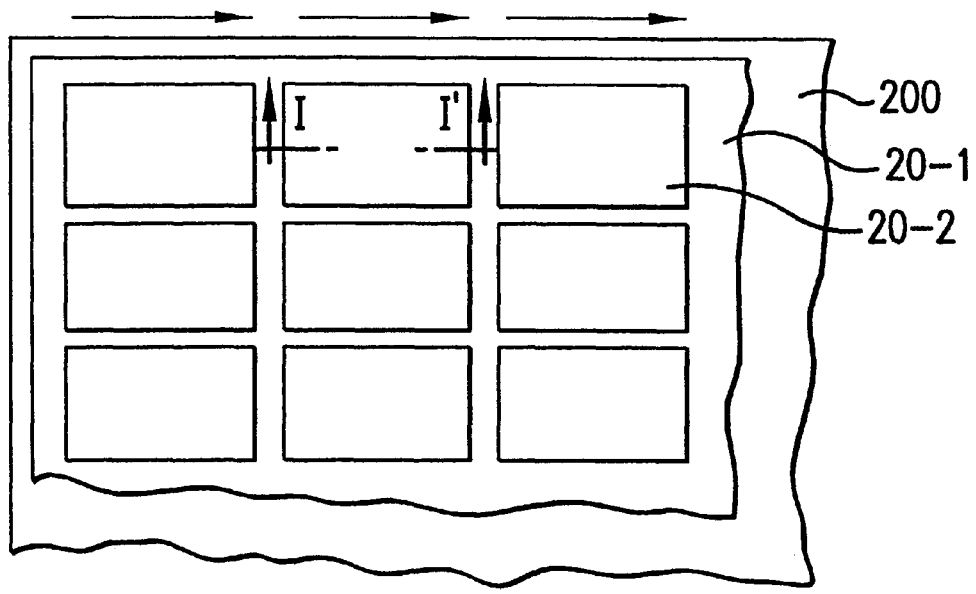
FIG. 2 shows a state of a crystallized silicon layer according to the related art.
Figure 3:
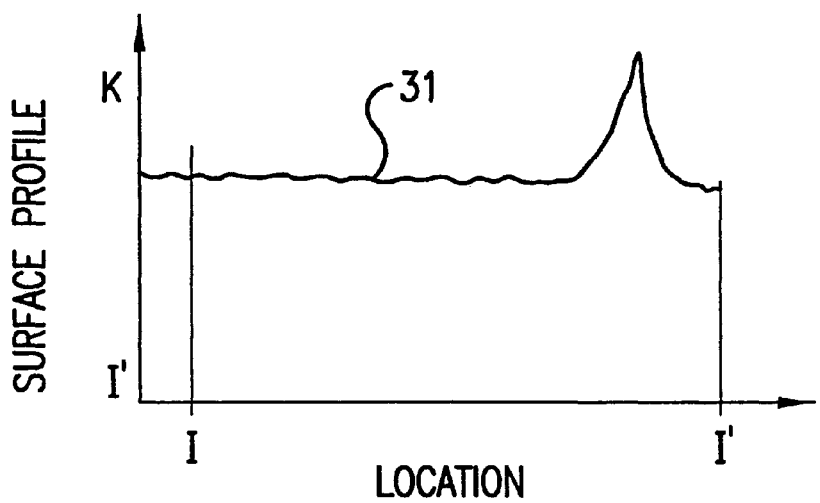
FIG. 3 shows surface profile of the crystallized silicon layer of FIG. 2.
Figure 4A:
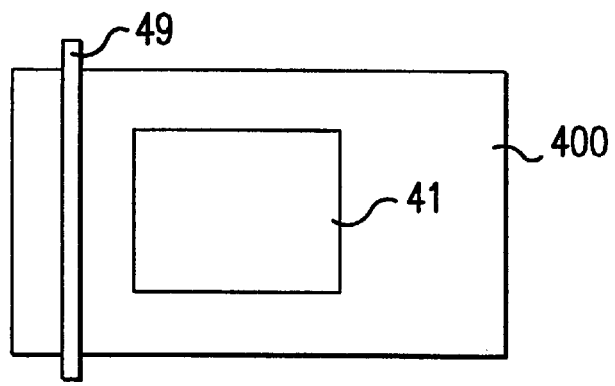
Figure 4B:
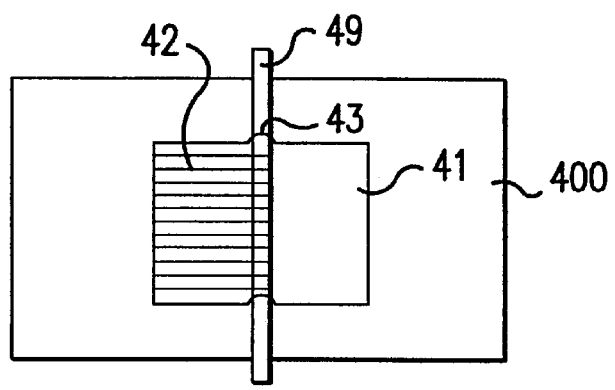
Figure 4C:
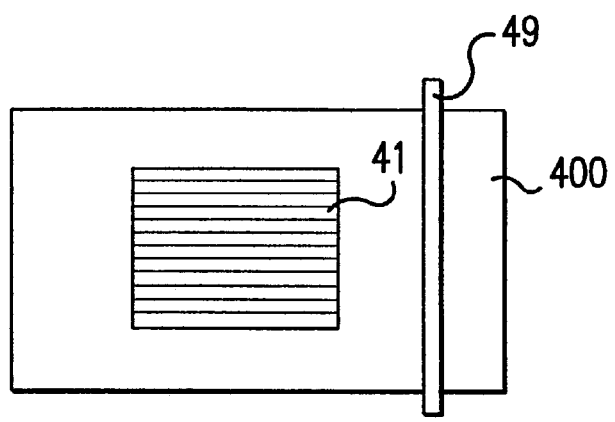
Figure 5A:
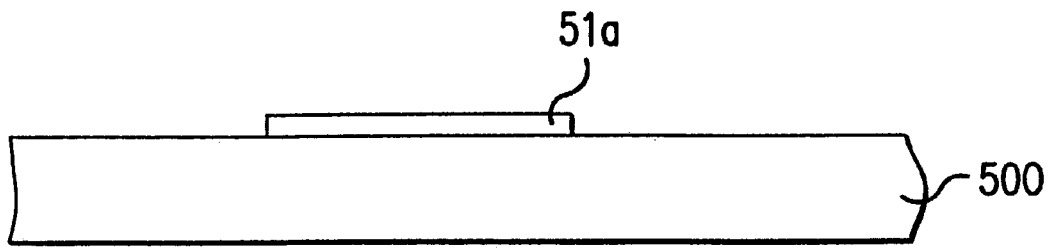
Figure 5B:
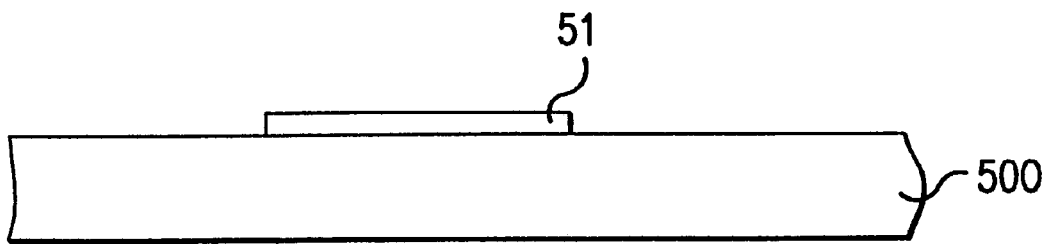
Figure 5C:
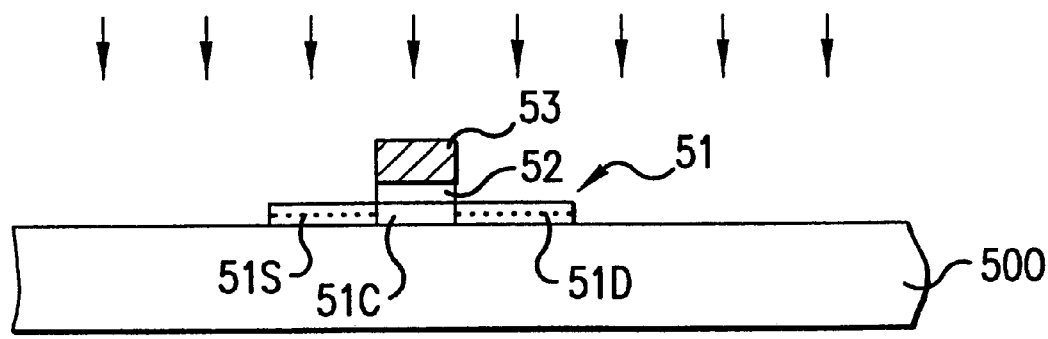
Figure 5D:
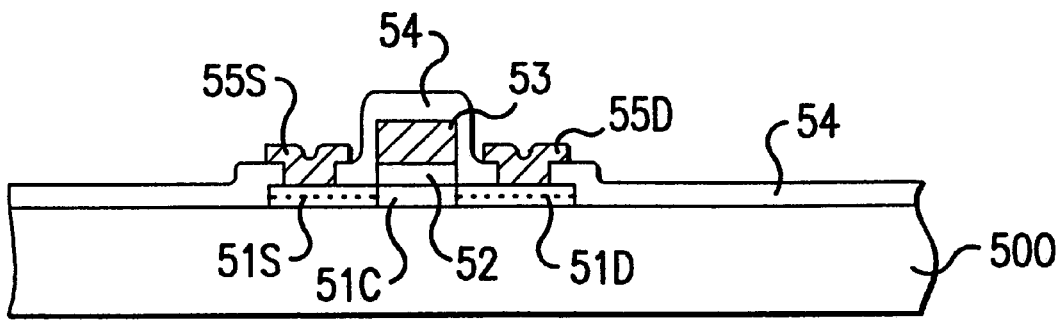
Figure 5E:
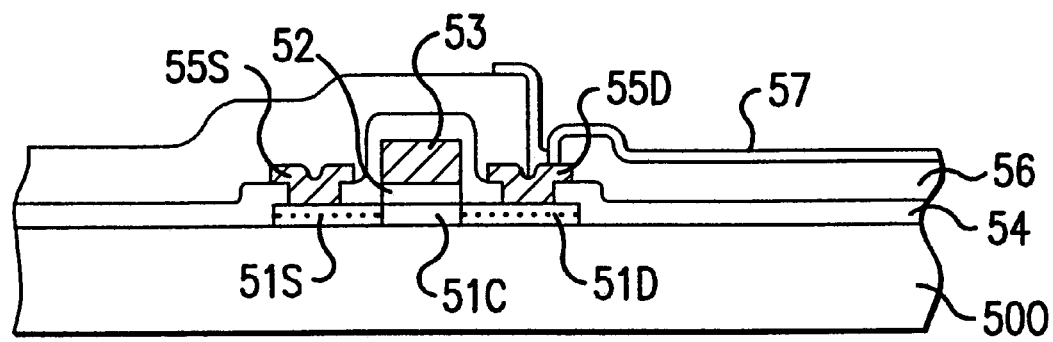

FIGS. 4A 4C show processed states of silicon crystallized by SLS according to the present invention; an FIGS. 5A 5E illustrate the process of fabricating a TFT. according to the present invention.

DETAILED DESCRIPTION OF PREFERRED EMBODIMENTS

Reference will now be made in detail to the preferred embodiment of the present invention, examples of which are illustrated in the accompanying drawings.

FIGS. 4A 4C show processed states of silicon crystallized by SLS according to the present invention.

Referring to FIG. 4A, an amorphous silicon layer is deposited on an insulated substrate 400. The amorphous silicon layer is patterned by photolithography to selectively remove a portion thereof, and the remaining potion of the amorphous silicon layer form an active layer 41. A laser beam having. an elongated shape 49 is provided as a laser annealing means for the SLS process.

Referring to FIG. 4B, crystallization of the silicon layer 41 by SLS is carried out by scanning the laser beam 49 over the substrate and the layer 41 at a predetermined speed or predetermined interval between the laser shots. The direction of growth of the silicon grains (indicated by the parallel lines 42) depends on the direction of scan of the laser beam 49. At any given time during the scan, the portion 43 of the active layer 41 that is melted and cooled the last protrudes upward due to the lack of space for flow for the increased volume of silicon. During the next laser irradiation, the. protruding part is melted and solidified, and the protruding portion is pushed to the right (the direction of the scan). This process is repeated for the successive laser irradiations. Both the moving direction of the protruding part and the growth direction of silicon grains are in the same direction (the direction of the scan) In FIG. 4B, the boundaries 42 of silicon grains that have been grown are generally perpendicular to the longer dimension of the laser beam 49.

Referring to FIG. 4C, the entire active layer 41 is preferably crystallized using SLS. The protruding part (designated by numeral 43 in FIG. 4B), which proceeds in the direction of growth of the grains (or the direction of the scan), finally reaches the end of the active layer 41. The liquid silicon that is melted by the last laser irradiation finally turns into solid silicon. Since free space exist adjacent the portion of the last melted silicon, the silicon is not pushed upward and no protrusion is formed.

The surface of the active layer is increased due to the increased volume of silicon during solidification. Thus, the surface area of the active layer 41 is increased due to flow of the grain boundaries during the last cooling and expansion, while the entire surface of the active layer 41 is smooth. Thus, an etching step is unnecessary for removing the surface unevenness of the active layer 41 and can be omitted.

Using SLS, the method according to the present invention does not crystallize the whole surface of the amorphous silicon layer, but only crystallize a selected part which has been patterned. Consequently, a silicon layer having a planar surface is formed by eliminating the increased volume of silicon during crystallization by laterally increasing surface area of the silicon layer.

FIGS. 5A 5E illustrate, using cross-sectional views, a method of fabricating a TFT after an amorphous silicon layer has been crystallized according to the present invention. A coplanar typed TFT having pixel electrodes is explained in the following description. The process for fabricating a TFT may be applied to a process of fabricating a TFT on an insulated substrate.

Referring to FIG. 5A, an amorphous silicon layer is deposited on an insulated substrate 500 such as a glass substrate An active layer 51 a of amorphous silicon is formed by etching the amorphous silicon layer with photolithography.

Referring to FIG. 5B, the active layer of amorphous silicon is crystallized to form crystallized active layer 51. Silicon grains are grown in one direction during crystallization using SLS. As the grains are arranged in one direction, charge carrier mobility of the silicon layer formed by the present invention is higher than that of polycrystalline silicon layer formed by the method of the related art. An active layer 51 having a smooth surface throughout the entire area is obtained.

The present invention provides an active layer of which surface becomes smooth by eliminating an increased volume of silicon during crystallization by increasing surface of a silicon layer as described in FIGS. 4A to 4c, which is achieved by crystallizing the amorphous silicon layer which has been patterned as an active layer by etching the amorphous silicon layer using photolithography, whereby improving the characteristics of a TFT.

Referring to FIG. 5C, an insulating layer (not shown), and a first conductive layer (not shown) are deposited successively on an exposed surf ace of the substrate including the active layer 51. A gate electrode 53 is formed by etching the conductive layer, and a gate insulating layer 52 is formed by etching the insulating layer. A source region 51S and a drain region 51D are then formed by doping exposed portions of the active layer. 51 with impurities. A channel region 51C is defined between the source region 51S and the drain region 51D.

Referring to FIG. 5D, an insulating interlayer 54 is deposited on an exposed surface of the substrate including the gate electrode 53. Contact holes exposing portions of the source region. 51S and the drain region 51D are formed by etching the insulating interlayer 54 using photolithography. A second conductive layer is then deposited on an exposed surface of the substrate. A source electrode 55S connected to the source region 51S and a drain electrode 55D connected to the drain region 51D are formed by etching the second conductive layer by photolithography.

Referring to FIG. 5E, a passivation layer 56 is deposited on an exposed surface including the source electrode 55S and the drain electrode 55D. Another contact hole exposing a portion of the drain electrode 55D is formed by etching the passivation layer 56. Then, a transparent conductive layer is deposited on an exposed surface of the substrate. A pixel electrode 57 connected to the drain electrode 55D is formed by etching the transparent conductive layer.

The present invention may be applied to the fabrication a staggered or an anti-staggered typed TFT as well as to the fabrication of a coplanar typed TFT.

The present invention provides methods of crystallizing an amorphous silicon layer and fabricating a thin film transistor which has an active layer of which surface becomes smooth by eliminating an increased volume of silicon during crystallization by increasing surface of a silicon layer, which is achieved by crystallizing the amorphous silicon layer which has been patterned as an active layer by etching the amorphous silicon layer using photolithography, whereby improving the characteristics of a TFT.

Moreover, the process time of the method according to the present invention is greatly shortened, since only the active layer is crystallized.

It will be apparent to those skilled in the art that various modifications and variations can be made in the methods of crystallizing an amorphous silicon layer and fabricating a thin film transistor of the present invention without departing from the spirit or scope of the inventions. Thus, it is intended that the present invention cover the modifications and variations of this invention provided they come within the scope of the appended claims and equivalents.

What is claimed is:

1. A method of fabricating a thin film transistor, comprising the steps of:

forming an amorphous silicon layer on a substrate;

selectively defining an active layer by etching the amorphous silicon layer;

forming a crystallized active layer by crystallizing the active layer by sequential lateral solidification;

forming a gate insulating layer and a gate electrode on the crystallized active layer; and forming a source and a drain region by doping the crystallized active layer with impurities using the gate electrode as a mask.

2. The method of fabricating a thin film transistor according to claim 1, the method further comprising the steps of:

forming an insulating interlayer on an exposed surface of the substrate including the source and the drain region;

forming contact holes in the insulating interlayer exposing the source region and the drain region, respectively;

forming a source electrode connected to the source region and a drain electrode connected to the drain region on the insulating interlayer;

forming a passivation layer covering an exposed surface of the substrate including the source and the drain electrodes;

forming a contact hole in the passivation layer exposing the drain electrode; and forming a pixel electrode on the passivation layer connected to the drain electrode.

3. A method of crystallizing an amorphous silicon layer, comprising the steps of:

forming an amorphous silicon layer on a substrate;

selectively defining an active layer by etching the amorphous silicon layer; and forming a crystallized active layer by crystallizing the active layer by sequential lateral solidification.

4. A method of crystallizing an amorphous silicon layer, comprising the steps of:

forming an amorphous silicon layer on a substrate;

patterning the amorphous silicon layer selectively; and crystallizing the patterned amorphous silicon layer by sequential lateral solidification.

* * * * *